United States Patent
Wall

(10) Patent No.: US 12,193,177 B2
(45) Date of Patent: Jan. 7, 2025

(54) ADJUSTABLE DISPLAY DEVICE, AND MOTOR VEHICLE HAVING AN ADJUSTABLE DISPLAY DEVICE

(71) Applicant: AUDI AG, Ingolstadt (DE)

(72) Inventor: Christian Wall, Hitzhofen (DE)

(73) Assignee: AUDI AG, Ingolstadt (DE)

( * ) Notice: Subject to any disclaimer, the term of this patent is extended or adjusted under 35 U.S.C. 154(b) by 104 days.

(21) Appl. No.: 18/003,601

(22) PCT Filed: Jun. 23, 2021

(86) PCT No.: PCT/EP2021/067178
§ 371 (c)(1),
(2) Date: Dec. 28, 2022

(87) PCT Pub. No.: WO2022/002723
PCT Pub. Date: Jan. 6, 2022

(65) Prior Publication Data
US 2023/0254986 A1 Aug. 10, 2023

(30) Foreign Application Priority Data
Jun. 29, 2020 (DE) ...................... 10 2020 116 984.1

(51) Int. Cl.
*H05K 5/02* (2006.01)
*B60K 35/00* (2006.01)
(Continued)

(52) U.S. Cl.
CPC ............ *H05K 5/0217* (2013.01); *B60K 35/00* (2013.01); *B60K 35/10* (2024.01); *B60K 35/22* (2024.01);
(Continued)

(58) Field of Classification Search
CPC ........................... H05K 5/0217; B60K 35/223
See application file for complete search history.

(56) References Cited

U.S. PATENT DOCUMENTS

2006/0038745 A1  2/2006  Naksen et al.
2017/0023978 A1* 1/2017  Cho ...................... G06F 1/1652
(Continued)

FOREIGN PATENT DOCUMENTS

DE          101 15 050 A1    10/2002
DE     10 2014 006 338 A1    5/2015
(Continued)

OTHER PUBLICATIONS

International Search Report (Form PCT/ISA/210); mailed Sep. 21, 2021 in corresponding PCT Application No. PCT/EP2021/067178 (3 pages) (3 pages English Translation).
(Continued)

*Primary Examiner* — Sherman Ng
(74) *Attorney, Agent, or Firm* — STAAS & HALSEY LLP

(57) ABSTRACT

In an example, a display device may include a flexible display surface element disposed in a housing of the display device; and an adjustable carrier element having a flexible portion and a rigid portion. The flexible portion of the carrier element faces the interior of the housing, the rigid portion is in form of a linear guide and is directed toward external surroundings of the housing, and the flexible portion has at least one guide element. The display device may include a guide apparatus having a supporting surface positioned along the adjustment plane, which guide apparatus may include at least one rail element running along the adjustment axis, which rail element is directed such that the at least one guide element is guided along the adjustment axis in the rail element as the carrier element is adjusted; and an adjustment apparatus configured to control a change between a storing position and a roll-out position of the display surface element by moving the carrier element.

14 Claims, 2 Drawing Sheets

(51) Int. Cl.
  *B60K 35/10* (2024.01)
  *B60K 35/22* (2024.01)
  *B60K 35/53* (2024.01)

(52) U.S. Cl.
  CPC ............ *B60K 35/223* (2024.01); *B60K 35/53* (2024.01); *B60K 2360/1438* (2024.01)

(56) References Cited

U.S. PATENT DOCUMENTS

2020/0365063 A1* 11/2020 Park .................. H04N 5/64
2021/0216183 A1* 7/2021 Kang .................. G09F 9/301

FOREIGN PATENT DOCUMENTS

| DE | 10 2015 011 614 A1 | 9/2017 |
| DE | 10 2020 116 984.1 | 6/2020 |
| EP | 1245429 A2 | 3/2002 |
| WO | PCT/EP2021/067178 | 6/2021 |

OTHER PUBLICATIONS

Written Opinion (Form PCT/ISA/237); mailed Sep. 21, 2021 in corresponding PCT Application No. PCT/EP2021/067178 (5 pages) (7 pages English Translation).

Form PCT/IB/338; Notification of Transmittal of Translation of the International Preliminary Report on Patentability; mailed Jan. 12, 2023 in corresponding PCT Application No. PCT/EP2021/067178 (1 page).

Form PCT/IB/373; International Preliminary Report on Patentability; mailed Dec. 13, 2022 in corresponding PCT Application No. PCT/EP2021/067178 (1 page).

Form PCT/IB/326; Notification Concerning Transmittal of International Preliminary Report on Patentability; mailed Jan. 12, 2023 in corresponding PCT Application No. PCT/EP2021/067178 (1 page).

* cited by examiner

ADJUSTABLE DISPLAY DEVICE, AND MOTOR VEHICLE HAVING AN ADJUSTABLE DISPLAY DEVICE

CROSS-REFERENCE TO RELATED APPLICATIONS

This application is a U.S. national stage of International Application No. PCT/EP2021/067178, filed on Jun. 23, 2021, which International Application claims the priority benefit of German Application No. 10 2020 116 984.1 filed on Jun. 29, 2020. Both the International Application and the German Application are incorporated by reference herein in their entirety.

BACKGROUND

An aspect of an invention relates to a motor vehicle with an adjustable display device, that is with a movable display device. By a display device, an appliance, an appliance group or an appliance component is understood, which is configured for displaying an image content, in particular a display.

Displays in the vehicle become increasingly larger and are positioned at very different locations in a vehicle cockpit. Additionally, there is the desire to configure displays variable in their size, for example to design them retractable and extendable. Furthermore, the displays are to be touch-operable, that is operable with a touch on a touch-sensitive surface.

DE 10 2015 011 614 A1 describes a display device for a motor vehicle with a flexible display apparatus and a linear guide, by means of which a first part of the display apparatus is guided.

DE 101 15 050 A1 relates to a display device, which includes a flat screen as well as positioning means, by which the flat screen is movable into a desired viewing position.

From DE 10 2014 006 338 A1, a display device for a motor vehicle is known, comprising a housing with a channel, in which a display element is adjustably disposed, which comprises a first display area and a second display area, which opposes the first display area, wherein the display element is adjustable into a first position, in which the first display area protrudes from the channel, and into a second position, in which the second display area protrudes from the channel.

In extendable displays, there is the disadvantage, especially if they are composed of a rigid and a flexible portion, that they do not have sufficient rigidity. A touch operability, thus an operation by touch, is thereby impeded because a flexible display fast bulges and does not offer resistance.

SUMMARY

Described is a display device with a more stable and secure touch operability.

Described example may be recited according to the independent claims. Advantageous developments may be given by the dependent claims.

In an example, a display device is provided, which does not only comprise a flexible display surface element, but a combination of a flexible, thus bendable, carrier of the display surface element and an additional linear guide. The display surface element is pulled to a rail element by the guide elements in the respective extension position to form a full-surface support to the rail element. The rail element is fixedly disposed in the interior of the interior trim element. Thereby, the bendable—thus flexible—display is already tightened during the extension and also remains tight in the extended state such that a touch operation is very simple. The construction is very stable and allows adjusting the display surface to different sizes without stability being lost. By the forced coupling, thus, a full-surface, stable support for example for a display in different extension positions is achieved and thus a secure touch operation is allowed.

In an example, a comprises a bendable display surface element disposed in a housing. Optionally, the housing can be an interior trim element of a motor vehicle, for example a control panel or a hood. By a display surface element, a component or a component group is understood, which provides a surface to display an image content. This display surface can for example be configured as a screen for a projection or as a screen, for example, as an OLED screen. By a flexible display surface element, it is understood that it is not rigid or stiff, in other words is rollable or foldable.

The display device additionally comprises an adjustable carrier element, thus a component or a component group as a carrier, which is disposed such that the carrier element can be adjusted, displaced or moved. The adjustable carrier element comprises a flexible and a rigid portion. The carrier element is extensively disposed, for example adhered, mounted or welded, on a rear side of the flexible display surface element with its front side.

The flexible portion of the carrier element is disposed facing the interior of the housing with respect to an adjustment plane of the carrier element, thus that plane, in which the carrier element is moved out of the housing or into the housing. Thus, the adjustment plane presets the direction of movement of the carrier element out of the housing or into the housing. The adjustment or movement axis, along which the carrier element is displaced, is also situated in the adjustment plane.

In other words, a flexible half of the carrier element can for example be that portion, which first plunges into the interior of the interior trim element upon retracting the carrier element, and last exits the interior of the interior trim element upon extending the carrier element.

The rigid portion, which can also be referred to as support portion, is configured as a linear guide and directed or disposed towards the external surroundings of the interior trim element with respect to the adjustment plane. In other words, it is the extensive, rigid portion of the carrier element, which first exits the interior of the interior trim element if the carrier element is extended, and the last part, which again retracts into the interior of the interior trim element upon retracting the carrier element.

The flexible portion of the adjustable carrier element comprises at least one guide element. By a guide element, a component or a part of the rear side of the carrier element is understood, which is disposed at the rear side of the carrier element, but projects from the rear side. Accordingly, the guide element can for example be configured as a slide, as a ball or as a block. In an example, only the flexible portion of the adjustable carrier element can comprise the at least one guide element. In this option, upon storing or stowing the display surface element (and thereby the carrier element), all of the guide elements can be decoupled from for example a rail, whereby an ever larger portion of the carrier element—and thereby of the display surface element—can be stowed in very space-saving manner.

In addition, the display device comprises a stationary guide apparatus with a supporting surface disposed along the adjustment plane, for example, a planar or flat surface, which includes at least one rail element running along the adjustment axis. The at least one rail element is directed such that the at least one guide element is supported in the rail element upon adjusting the carrier element along the adjustment axis and is guided by the rail element. In other words, the arrangement of rail element and the at least one guide element may be configured such that the at least one guide element is retained on the stationary guide apparatus by the rail element upon extending the carrier element and is guided along the adjustment axis. Thus, a detachable form fit of guide element and rail element is formed to bring the carrier element into the desired position and to support and tighten the carrier element at the same time.

The display device comprises an adjustment apparatus, which is configured to control a change between a storage position of the display surface element (accordingly between a storage position of the carrier element) and a roll-out position of the display surface element (and thereby a roll-out position of the carrier element) by moving or displacing or adjusting the carrier element. The storage position can also be referred to as stowage position and is that position, in which the carrier element with the display surface element is at least partially recessed, for example rolled up, in the interior of the interior trim element. The roll-out position or extension position is that position, in which, compared to the storage position, the carrier element further protrudes from the interior trim element displaced along the adjustment axis than in the storage position.

The above discussed advantages may arise.

A strength of the display surface element, thus the stability thereof, results from the fact that the rigid linear guide of the carrier element supports an upper area of the display surface element and the at least one guide element is retained and directed by the guide apparatus such that the flexible portion of the carrier element is thereby also tightened. In that the flexible portion can be folded or rolled up, the carrier element with the display surface element can be stowed in the storage position in very space-saving manner.

In an example, the carrier element can comprise at least two guide elements, which are disposed in a row along the adjustment axis. In other words, the carrier element can comprise at least two guide elements, which form a row, which runs along the adjustment axis or parallel to it. Thereby, the display surface element is even better supported without a higher space requirement existing in the storage position, or only a very low additional space requirement arises by the additional guide elements.

In an example, the carrier element can comprise at least two rows of guide elements, in other words, the carrier element can for example be supported on the left and right by each one row of guide elements. Thereby, the stability is even much more increased.

In an example, the at least one rail element extends as a circular arc in the interior of the housing. The guide elements and thereby the carrier element are thereby also guided along the guide element in the storage position and in retracting or extending, respectively, but in space-saving manner such that folds or kinks do not appear in the display surface element or in the carrier element despite of the guide in the interior of the interior trim element.

The rigid portion of the carrier element and the flexible portion of the carrier element may be in a plane, thus for example form a rear side of the carrier element without steps. In other words, in the area of the rigid portion, the carrier element (and thereby the combination of display surface element and carrier element) can have the same thickness as in the area of the flexible portion. This ensures an even more stable form fit between carrier element and guide element. The form fit is detachable and is thus ideally designed for a touch operation of a display adjustable in size.

According to a further example of the display device, the at least one guide element can be arranged such that the guide element is outside of the rail element in the storage position and slides into the rail element upon adjusting the carrier element into the roll-out position. Thus, at a certain point, in stowing, the guide element or multiple guide elements are coupled out of the rail element such that the flexible carrier element with the flexible display surface element can be stowed in even more space-saving manner. This advantage in particular may arise if the at least one rail element does not comprise a circular arc in the interior of the interior trim element.

According to a further example of the display device, the carrier element comprises at least two guide elements, wherein at least a portion of the guide elements is disposed such that the portions are outside of the rail element in the storage position and slide into the respective rail element upon adjusting the carrier element into the roll-out position. The advantages were already discussed.

The described examples may include a motor vehicle, which comprises an described examples of the display device. The motor vehicle may be configured as a car, in particular as a passenger car or truck, or as a passenger bus or motorcycle.

In an example, developments of the motor vehicle according may comprise features as they have already been described in context of the developments of the display device, and also belong to the described examples. For this reason, the corresponding developments of the motor vehicle according to the described examples are not again described here.

The described examples also include the combinations of the features of the described examples.

BRIEF DESCRIPTION OF DRAWINGS

These and other aspects and advantages will become more apparent and more readily appreciated from the following description of the examples, taken in conjunction with the accompanying drawings of which.

DESCRIPTION

Figure 1:
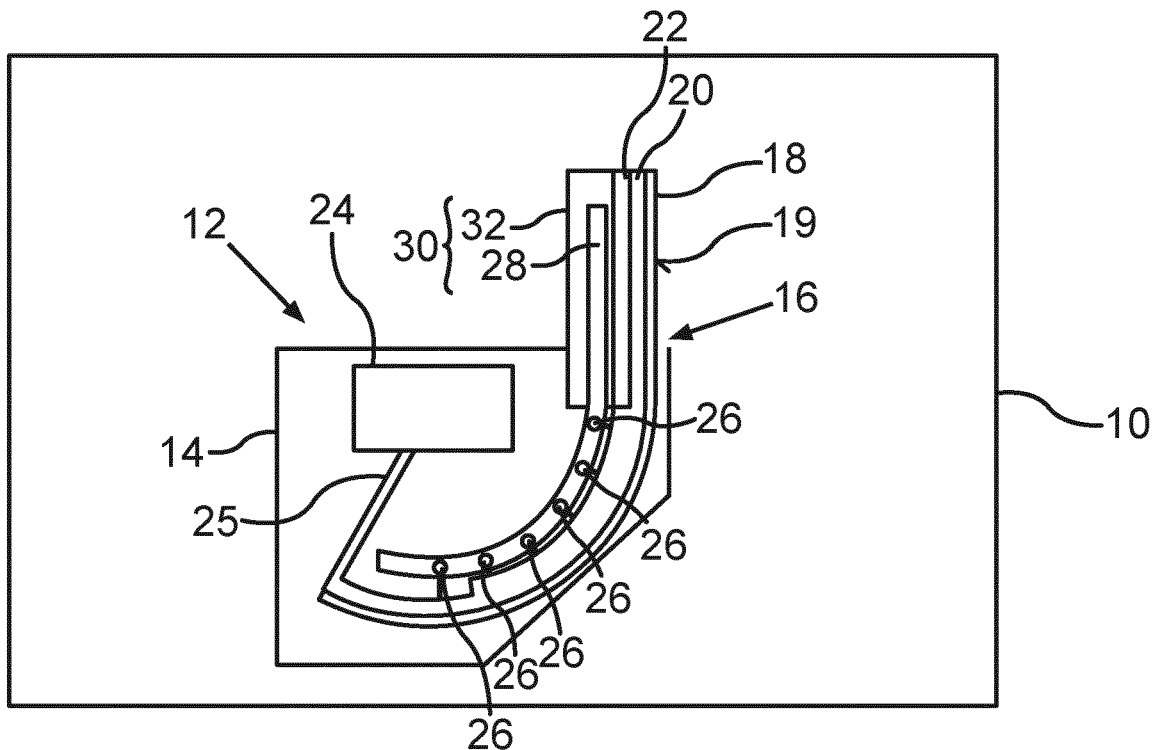
FIG. 1 a schematic representation to a first example of a display device and of a motor vehicle according to an example in cross-section, in which the display device is visible in the storage position.

The examples explained in the following are examples of the invention. In the examples, the described components of the examples each represent individual features which may be considered independently of each other, which also each develop the examples independently of each other. Therefore, the disclosure is to include also combinations of the features of the examples different from the illustrated ones. Furthermore, the described examples can also be supplemented by further ones of the already described features of the examples.

In the figures, identical reference characters each denote functionally identical elements.

FIG. 1 illustrates the principle of the motor vehicle 10 according to an example, which can for example be configured as a passenger car, and of the display device 12 according to an example in cross-section.

The display device 12 comprises a housing 14, which has an opening 16, through which the combination of the carrier element 20 and the display surface element 18 can be extended from and retracted into the housing. If the display device 12 is installed in a motor vehicle 10, the housing 14 can for example be an interior trim element of the motor vehicle 10, for example a center console, a door trim, a control panel or a hood.

FIG. 1 shows the display device 12 in a position, in which a part of a display surface element 18 is extended from the housing 14 through the opening 16. For example, this can already be the storage position, in which the display surface element 18 is adjusted in a rest position. Alternatively, a larger part of the display surface element 18 or the entire display surface element 18 can be retracted into the housing 14 in the storage position.

In an example, the display surface element 18 can be configured as a display with organic light emitting diodes (OLEDs) and is flexible, this means that the display surface element 18 is bendable, pliable and rollable. Alternatively, the display surface element 18 can for example be a screen, and in this option, the display device 12 can additionally comprise a projector, which can be disposed in the motor vehicle 10 such that the projector projects an image onto the display surface element 18 in form of the screen.

The display surface element 18 is extensively disposed on a carrier element 20, wherein the carrier element 20 is connected to the rear side of the display surface element 18. The front side of the display surface element 18 is that side, on which a display content can be displayed, thus for example the projection surface or the screen surface. A front side 19 of the display surface element 18 can be formed as a touchscreen, thus as a touch-sensitive surface or touch-sensitive screen.

As in the example of FIG. 1, the carrier element 20 can be made of a flexible material across the entire surface, for example of a metal or a plastic. In the example of FIG. 1, the carrier element 20 includes a rigid, thus non-flexible portion 22, which can be extensively mounted in a recess of the upper portion of the carrier element 20. Therein, the rigid portion 22 can for example be made of a stronger material or for example of a stiff plastic. The rigid portion 22 is located in the upper part of the carrier element 20, thus in that portion of the carrier element 20, which is first shifted out of the opening 16 upon extending the carrier element 20 with the display surface element 18. Thereby, the entire upper portion is rigid. The rigid portion 22 acts as a linear guide and imparts a strength to the display surface element 18 in this upper area such that the display surface element 18 can be extended out of the housing 14 beyond the rigid portion 22.

Figure 2:
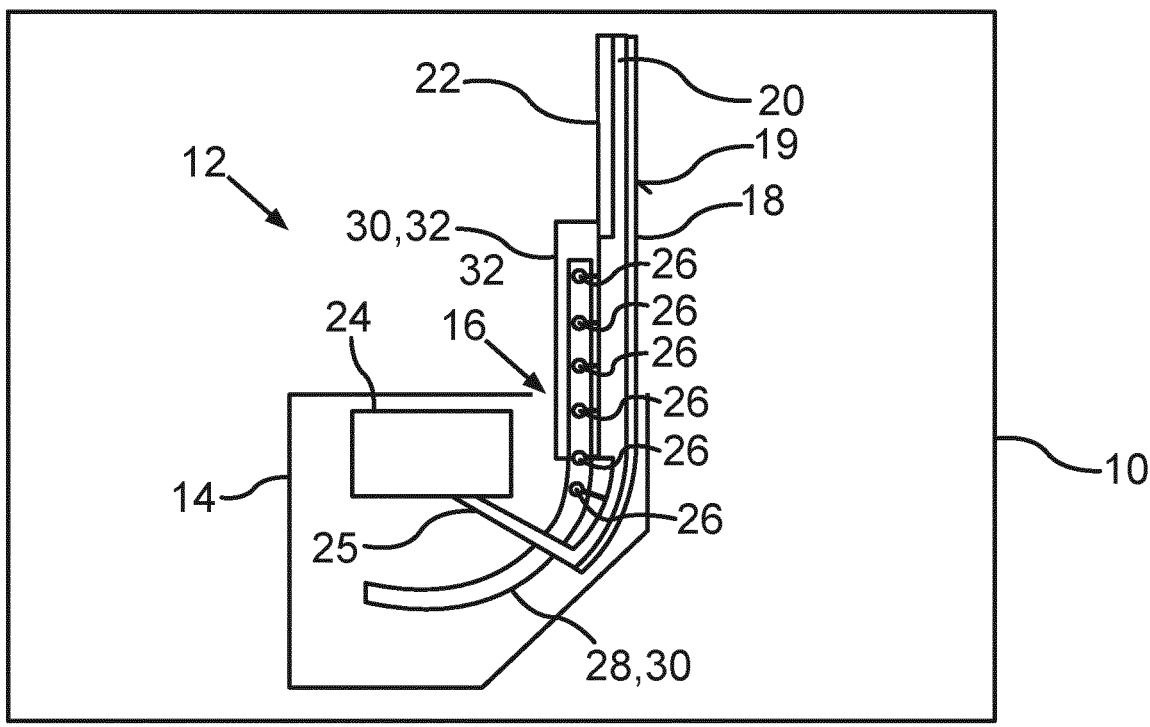
FIG. 2 a schematic representation to the first example in cross-section, in which the display device is visible in the roll-out position.

In addition, the example of FIG. 1 shows an adjustment apparatus 24 of the display device 12, which can for example include a motor, as well as for example a lever 25, which can be fixed to the carrier element 20, in particular to a rear, inner end of the carrier element 20, to shift the carrier element 20 and thereby also the display surface element 18 out of the housing 14 and/or into the housing 14. Therein, the adjustment axis presets the directions of movement, to the top in the example of FIG. 1, that is through the opening 16 out of the housing 14 and into the housing 14, respectively. The exemplary lever 25 can be adjusted for example up to 90 degrees by the motor for extending the carrier element 20 such that the carrier element 20 with the display surface element 18, as shown in FIG. 2, is then extended from the housing 14 in the roll-out position. Alternatively, the adjustment apparatus 24 can for example comprise a cable pull or hoist or other possibilities of moving a display as may be known to one of ordinary skill in the art, for moving the carrier element 20.

The detachable form fit between carrier element 20 and the housing 14 is effected by storing the guide elements 26 in a rail element 28 of the guide apparatus 30.

In an example, the rail element 28 can be configured as a rail or as a groove. Then, the guide elements 26 can be configured as balls or cuboids, and the shapes of the guide elements 26 and of the rail element 28 may be configured to each other such that the guide elements 26 are stored in the rail element 28 in form-fit manner, but can move within the rail along the adjustment axis, thus in the direction of movement.

Besides the rail element 28, the guide apparatus 20 also includes a linear guide element 32, on which the rigid portion 22 of the carrier element 20 can abut in the storage position (FIG. 1), the flexible portion of the carrier element 20 with the guide elements 26 in the roll-out position (FIG. 2).

FIG. 2 shows the carrier element 20 after the carrier element 20 has been shifted out by the adjustment apparatus 24. In the rail element 28, the guide elements 26 are almost exclusively in the linear area of the rail element 28 and the rear side of the carrier element 20 with the flexible portion thereof is retained and stabilized by the guide elements 26 in the rail element 28 and by the linear guide 32 in form-fit manner.

The arcuate configuration of the rail element 28 according to the examples of FIGS. 1 and FIG. 2 ensures that the carrier element 20 can be retracted into the housing 14 and stowed in space-saving manner in the storage position.

Figure 3:
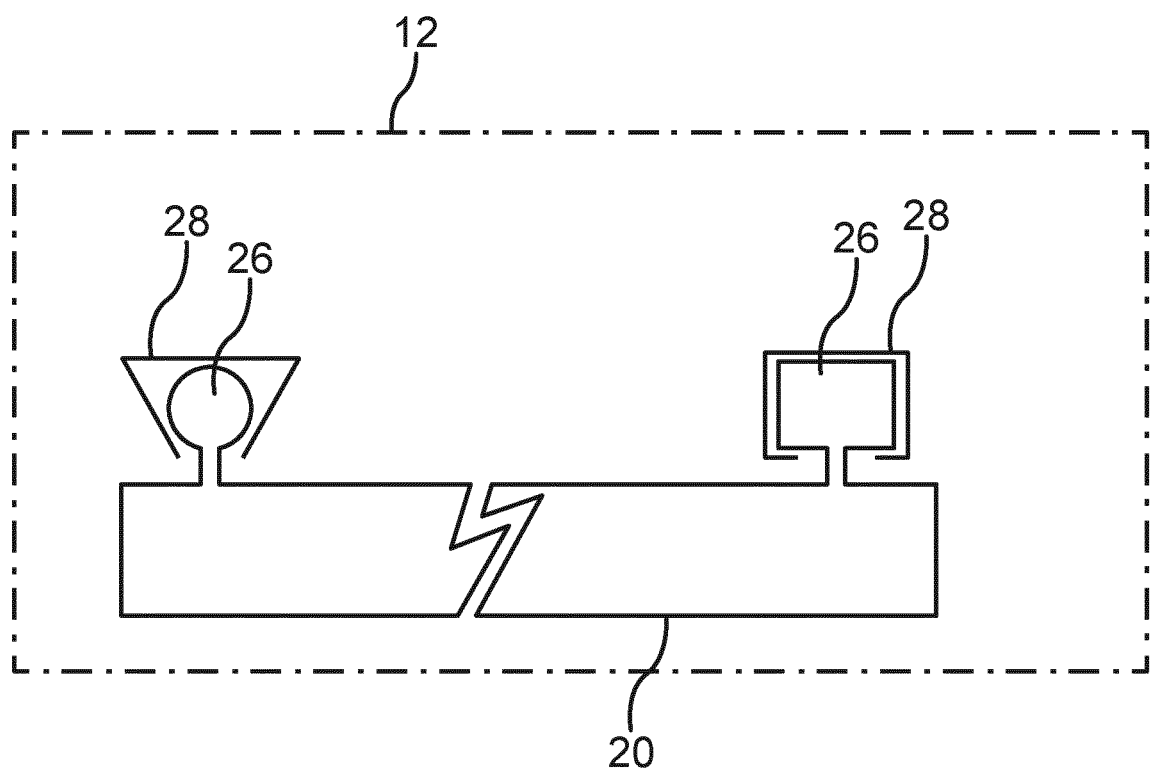
FIG. 3 a schematic representation to a further second example of the display device, in which a section of the display device is visible in plan view.

FIG. 3 shows a plan view to the carrier element 20 in an area, in which the entire thickness of the carrier element 20 is flexible. FIG. 3 shows an example, according to which the carrier element 20 can comprise two or more rows of guide elements 26, wherein the guide elements 26 are for example each configured as a ball on the one side and as a cuboid on the other side. However, each of the guide elements 26 can optionally be configured as a ball or cuboid. FIG. 3 in particular serves for illustrating that the guide elements 26 can be configured in a fit or in an approximate fit to the respective rail element 28, that is can be supported in the rail element 28 such that the guide elements 26 are retained by the rail element 28 in form fit or in an approximate form fit, but are movable as soon as the adjustment apparatus 24 causes a change between storage position and roll-out position.

Overall, the example shows how an arrangement for a flexible display surface element 18, in particular a flexible display, can be provided.

In the arrangement for example for an extendable flexible display, a flexible display carrier is for example coupled to a linear guide. The carrier element 20, thus for example the display carrier, can for example be pushed via an adjustment apparatus 24, for example a motor and simple kinematics.

In addition, multiple guide elements 26 may be located at the carrier element 20, which run to a second guide unit, the guide apparatus 30. Therein, a guide track of the rail element 28 transitions from a circular arc to a linear portion. The second guide unit has the task to prevent a possible bulge of the flexible carrier.

A stable support as full-surface as possible for the exemplary display in various extension positions is achieved and thus a secure touch operation is allowed.

A robust configuration of the entire unit and a stable and secure touch operation belong to the advantages.

A description has been provided with particular reference to examples, but it will be understood that variations and modifications can be effected within the spirit and scope of the claims which may include the phrase "at least one of A, B and C" as an alternative expression that means one or more of A, B and C may be used, contrary to the holding in Superguide v. DIRECTV, 358 F3d 870, 69 USPQ2d 1865 (Fed. Cir. 2004).

The invention claimed is:

1. A display device, comprising:
a flexible display surface element disposed in a housing of the display device; and
an adjustable carrier element with a flexible portion and a rigid portion, which is extensively disposed with a front side of the adjustable carrier element, on a rear side of the flexible display surface element, wherein
the flexible portion of the adjustable carrier element is disposed facing an interior of the housing with respect to an adjustment plane of the adjustable carrier element,
the rigid portion is configured as a linear guide and is directed towards external surroundings of the housing with respect to the adjustment plane, and
the flexible portion includes,
at least one guide element,
a stationary guide apparatus with a supporting surface disposed along the adjustment plane, the stationary guide apparatus includes at least one rail element running along an adjustment axis in the adjustment plane, which is directed such that the at least one guide element is guided along the adjustment axis in the at least one rail element upon an adjustment of the adjustable carrier element, and
an adjustment apparatus, which is configured to control a change between a storage position of the flexible display surface element and a roll-out position of the flexible display surface element by a movement of the adjustable carrier element, in which the adjustable carrier element protrudes further from the housing displaced along the adjustment axis compared to the storage position.

2. The display device according to claim 1, wherein the at least one guide element includes at least two guide elements, which are disposed in a row along the adjustment axis.

3. The display device according to claim 2, wherein the at least one guide element includes at least two rows of guide elements.

4. The display device according to claim 1, wherein the at least one rail element extends as a circular arc in the interior of the housing.

5. The display device according to claim 1, wherein the rigid portion of the adjustable carrier element and the flexible portion of the adjustable carrier element are situated in a plane of the rear side of the adjustable carrier element.

6. The display device according to claim 1, wherein the at least one guide element is disposed such that the at least one guide element is outside of the at least one rail element, respectively, in the storage position and slides into the at least one rail element upon an adjustment of the adjustable carrier element into the roll-out position.

7. The display device according to claim 6, wherein the at least one guide element includes at least two guide elements, wherein at least a portion of the at least two guide elements is disposed such that the at least two guide elements are outside of the at least one rail element, respectively, in the storage position and slide into the at least one rail element, respectively, upon an adjustment of the adjustable carrier element into the roll-out position.

8. A motor vehicle comprising:
a display device including, a flexible display surface element disposed in a housing of the display device; and
an adjustable carrier element with a flexible portion and a rigid portion, which is extensively disposed with a front side of the adjustable carrier element, on a rear side of the flexible display surface element, wherein
the flexible portion of the adjustable carrier element is disposed facing an interior of the housing with respect to an adjustment plane of the adjustable carrier element,
the rigid portion is configured as a linear guide and is directed towards the external surroundings of the housing with respect to the adjustment plane, and
the flexible portion includes,
at least one guide element,
a stationary guide apparatus with a supporting surface disposed along the adjustment plane, the stationary guide apparatus includes at least one rail element running along an adjustment axis in the adjustment plane, which is directed such that the at least one guide element is guided along the adjustment axis in the at least one rail element upon an adjustment of the adjustable carrier element, and
an adjustment apparatus, which is configured to control a change between a storage position of the flexible display surface element and a roll-out position of the flexible display surface element by a movement of the adjustable carrier element, in which the adjustable carrier element protrudes further from the housing displaced along the adjustment axis compared to the storage position.

9. The motor vehicle according to claim 8, wherein the at least one guide element includes at least two guide elements, which are disposed in a row along the adjustment axis.

10. The motor vehicle according to claim 9, wherein the at least one guide element includes at least two rows of guide elements.

11. The motor vehicle according to claim 8, wherein the at least one rail element extends as a circular arc in the interior of the housing.

12. The motor vehicle according to claim 8, wherein the rigid portion of the adjustable carrier element and the flexible portion of the adjustable carrier element are situated in a plane of the rear side of the adjustable carrier element.

13. The motor vehicle according to claim 8, wherein the at least one guide element is disposed such that the at least one guide element is outside of the at least one rail element, respectively, in the storage position and slides into the at least one rail element, respectively, upon an adjustment of the adjustable carrier element into the roll-out position.

14. The motor vehicle according to claim 13, wherein the at least one guide element includes at least two guide elements, wherein at least a portion of the at least two guide elements are disposed such that the at least two guide elements are outside of the at least one rail element, respectively, in the storage position and slide into the at least one rail element, respectively, upon an adjustment of the adjustable carrier element into the roll-out position.

* * * * *